United States Patent [19]

Smith et al.

[11] Patent Number: 4,618,826

[45] Date of Patent: Oct. 21, 1986

[54] QUALITY CONTROL PHANTOM FOR USE IN COMPUTED TOMOGRAPHIC IMAGING INSTRUMENTS AND METHOD OF USE

[75] Inventors: Stanford L. Smith, Lexington, Ky.; Paul C. Wang, Washington, D.C.; Charles W. Coffey, Lexington, Ky.

[73] Assignee: U.K. Research Foundation, Lexington, Ky.

[21] Appl. No.: 635,600

[22] Filed: Jul. 30, 1984

[51] Int. Cl.⁴ ............................................. G01R 33/20
[52] U.S. Cl. .................................. 324/308; 324/300; 324/318
[58] Field of Search ............... 324/300, 307, 308, 318, 324/319, 320, 322, 309

[56] References Cited

U.S. PATENT DOCUMENTS

| 4,422,042 | 12/1983 | Sugimoto | 324/319 |
| 4,528,510 | 7/1985 | Loeffler et al. | 324/308 |
| 4,551,678 | 11/1985 | Morgan et al. | 324/300 |

FOREIGN PATENT DOCUMENTS 197710  5/1977  U.S.S.R.

OTHER PUBLICATIONS

Damadian, et al., "Field-Focusing Nuclear Magnetic Resonance".

Smith, "A Phantom for Mapping Slice Thickness in X-Ray Computed Tomography", 1982, pp. 664-666.

Primary Examiner—Michael J. Tokar
Attorney, Agent, or Firm—King and Schickli

[57] ABSTRACT

A quality control phantom for a computed tomographic imaging instrument, such as a nuclear magnetic resonance scanner, is provided for the on-site calibration and standardization of image slice offset and angulation so as to maintain and insure proper operation. The phantom includes a cylindrical slab-like cast acrylic casing or body having a frustoconical groove formed therein. The groove is filled with a known material to effect a signal from the instrument. A scan taken by the NMR instrument across the frustoconical groove at an angle perpendicular to the central axis of the groove yields a circular image. The method for determining the image slice offset includes the step of relating the diameter of two such circular images so as to verify the distance one such image is from the other along the central axis of the groove. A scan taken by the NMR instrument across the frustoconical groove at an angle other than perpendicular to the central axis of the groove yields an elliptical image. The method for measuring the image slice angulation includes the step of comparing the distance from the groove to the central axis of the groove along the major axis of the elliptical image to the radius of the groove at the point where the major axis crosses the central axis of the groove.

13 Claims, 9 Drawing Figures

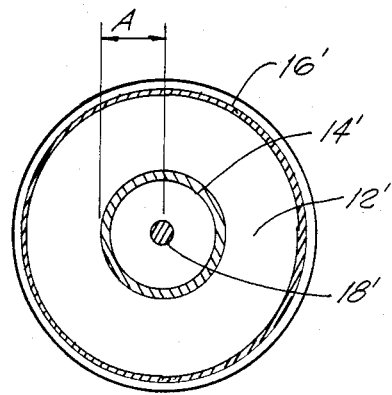
Fig. 5
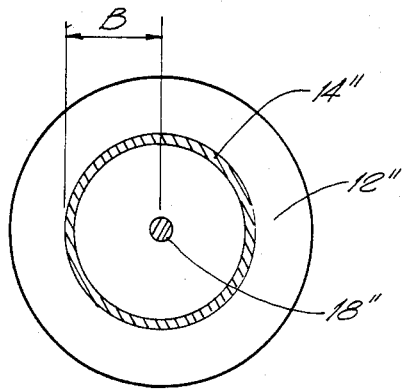
Fig. 6
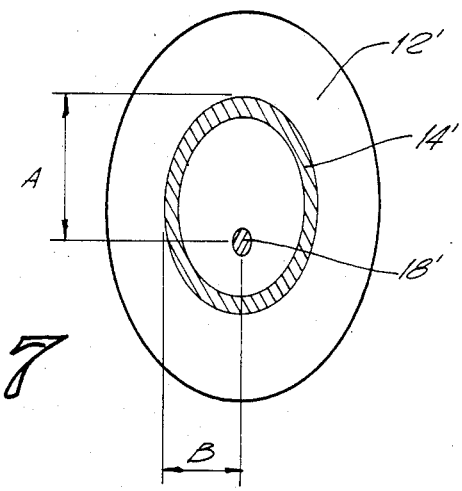
Fig. 7
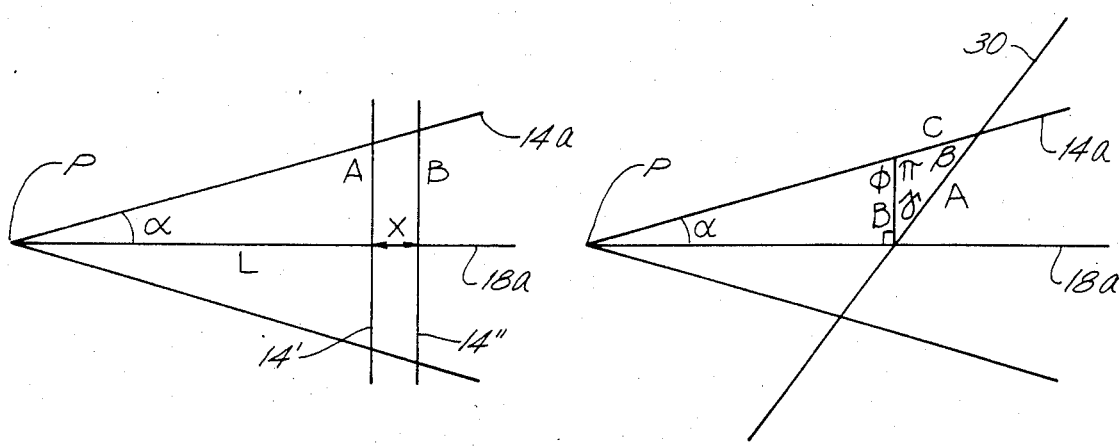
Fig. 8
Fig. 9

QUALITY CONTROL PHANTOM FOR USE IN COMPUTED TOMOGRAPHIC IMAGING INSTRUMENTS AND METHOD OF USE

TECHNICAL FIELD

The present invention relates generally to quality control phantoms and, more particularly, to a phantom having a configuration to provide readings for the on-site calibration and standardization of image slice offset and angulation in computed tomographic imaging instruments, such as nuclear magnetic resonance scanners.

BACKGROUND ART

U.S. Pat. Nos. 3,789,832 and 4,354,499 to Damadian disclose a nuclear magnetic resonance (hereinafter NMR) instrument and a method for forming images of the internal organs of a patient that aid physicians in diagnosing illnesses. Advantageously, the procedure is performed without subjecting the patient to X-rays that may damage tissue.

A patient is positioned within the NMR instrument that includes a large circular magnet. The magnet produces magnetic fields about 6000 times as strong as the magnetic field of the earth. These strong magnetic fields cause certain "nuclear magnets" in the patient's body to line up in the direction of the field. A radio wave of a chosen frequency is then beamed through the patient. Some of the nuclei that lined up in the magnetic field absorb the radio wave energy and flip so that their nuclear magnets change direction. When the radio wave transmission is terminated, the realigned nuclei return to their original orientation in the magnetic field emitting characteristic and detectable radio signals as they flip.

Neither the transmission of magnetic fields or radio waves through the body damages the tissue. Further, the resulting radio signals from the nuclei indicate how many atoms of a certain kind are at a particular point in the sample since the magnetic strength of each differs from the strength of others.

A computer combines the signals from the nuclei so as to construct an accurate image of the interior of the body of the patient. It is this image that is displayed on a video screen or printed so that the physicians can study it. The NMR instrument enables a physician to look at details of the body structure. Specifically, the resulting image allows the detection of possible disease through tissue that looks unusually light or dark.

Should the physician uncover a scan image of particular concern, he undoubtedly will wish to obtain further information by scanning at a slightly different location or angle. This may be done by utilizing the image slice offset and/or image slice angulation features of the instrument. The image slice offset relates to the distance moved along a scanning axis from one scan position to another. The image slice angulation relates to the angle at which the scan is aligned with respect to the scanning axis and the perpendicular. It, however, should be appreciated that it is imperative that the image slice offset and angulation are being properly indicated by the instrument so that the physician may accurately choose a field or plane of scan, and in turn receive an accurate picture of the tissue in question.

The parameters of image slice offset and angulation, are particularly difficult to verify as no actual hardware within the NMR instrument moves as the field of scan is moved. Rather, the electrical current to the magnet surrounding the patient is altered so as to change the magnetic gradient and move the field of scan. Thus, the scan positioning is software controlled and there can be no visual verification of the angulation and offset through the examination of the instrument itself.

Consequently, a need is identified for an apparatus and method allowing the verification of NMR instrument image slice offset and angulation. In particular, the on-site verification of image slice offset and angulation advantageously enables the physician to confidently and accurately position the field of scan so as to obtain the desired scan image allowing improved diagnosis of patient tissue, and thus the illness. Further, this need exists with all computed tomographic imaging instruments and methods such as X-ray computed tomography and positron emission tomography.

DISCLOSURE OF THE INVENTION

Accordingly, it is a primary object of the present invention to provide an apparatus and method for the quality control of diagnostic computed tomographic imaging instruments allowing on-site calibration and standardization of an instrument.

Another object of the present invention is to provide a quality control phantom that may be positioned within the computed tomographic imaging instrument allowing the determination, verification and calibration of image slice offset and angulation parameters so as to maintain and insure proper instrument operation.

Still another object of the present invention is to provide a method for the determination and verification of the image slice offset and angulation of an NMR instrument.

A further object of the present invention is to provide a method for the on-site calibration and standardization of the image slice offset and angulation of an NMR instrument so as to insure proper positioning of the scanning field, thereby providing more accurate information for improved diagnosis.

Additional objects, advantages and other novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects and in accordance with the purposes of the present invention as described herein, an improved apparatus and method are provided for the on-site verification, calibration and standardization of image slice offset and angulation, for example, in an NMR instrument.

The quality control phantom for use in the calibration and standardization of an NMR instrument includes a casing and a frustoconical groove formed in the casing. The groove is filled with a material providing a different and distinguishing signal from the casing during scanning with the instrument so as to advantageously allow the measurement of image slice offset and angulation through the use of the actual scan image.

The casing may be constructed of cast acrylic and substantially cylindrical in shape. Preferably, the phantom includes a means for accurately locating the phantom in the NMR instrument so as to identify a predetermined position along the internal frustoconical groove as an initial scanning point. The utilization of a known or predetermined home scanning position greatly simplifies the computations necessary in measuring actual image slice offset. The locating means is an annular slot extending around the periphery of the casing in a plane perpendicular to the central axis of the frustoconical groove. The locating slot is also filled with a material providing a different and distinguishing signal from the casing during scanning.

Advantageously, the phantom may also include a central bore corresponding to the central axis of the frustoconical groove. The central bore is filled with a material providing a signal distinguishable from the casing during scanning with the instrument. The scan image produced by the bore aids the physician or technician particularly in measuring image slice angulation in accordance with the method and formula discussed below.

Together the signal producing locating slot and central bore speed the analysis of the scan images, and enhance the available information for determining actual image slice offset and angulation. Further, the locating slot and central bore cooperate with the frustoconical groove of the phantom to enable the adjustment of the NMR instrument circuitry within the closest possible tolerances to accurately reflect actual image slice offset and angulation. This leads to increased control of scanning field positioning, thereby enabling the physician to make a more accurate and complete study of discovered patient tissue irregularities. This, in turn, leads of course to a more competent diagnosis of patient illness.

In a further aspect of the invention, in accordance with its objects and purposes, a method for measuring image slice offset along a scanning axis of an NMR instrument or other computed tomographic imaging device is provided.

The first step of the method involves positioning a phantom, as described above including a signal producing frustoconical groove, in the instrument so that the central axis of the groove is aligned with or parallel to a particular scanning axis of the instrument. The second step is scanning across the frustoconical groove at a predetermined first position along the groove and at an angle perpendicular to the central axis of the groove. The scanning is performed by simply activating the basic scanning circuitry. The resulting image is circular in configuration. Next, the image slice offset circuitry of the NMR instrument is activated and an additional scanning step is performed to scan across the frustoconical groove at a second position along the scanning axis of the instrument. Again the scan is taken at an angle perpendicular to the central axis of the groove so as to obtain a second circular image. The final step involves comparing the radii of the first and second circular images so as to determine and verify the actual distance moved along the scanning axis of the instrument between the first and second positions. The offset distance moved is provided by the following formula:

$$X = \frac{(B - A)}{A} \cdot C_1$$

where
X = offset distance moved;
A = first image radius;
B = second image radius; and $C_1$ = a known constant for the particular frustoconical groove.

In a still further aspect of the invention, in accordance with its objects and purposes, a method is provided for measuring the image slice angulation along the scanning axis of a computed tomographic imaging instrument.

The initial step of this method involves positioning the phantom, including a signal producing frustoconical groove and central bore in the instrument so that the central bore or axis of the groove is parallel to a particular scanning axis of the instrument. The basic image circuitry and the slice angulation circuitry of the instrument are then activated to perform the step of scanning across the frustoconical groove at an angle other than perpendicular to the central bore of the groove and scanning axis of the instrument. The resulting scan image of the groove is elliptical in shape. Next, is the step of determining the distance along the major axis of the elliptical image from the groove image to the central bore image. This is done by viewing and measuring the scan on the computer CRT. Then the radius of the frustoconical groove at the point where the major axis of the elliptical image crosses the central bore is measured and determined. This is done by measuring the distance along the scan image from the central bore to the groove along a line perpendicular to the major axis of the image. The final step involves comparing the two distances in accordance with the following formula to yield the actual image slice angulation:

$$\gamma = 180 - \pi - [\arc \sin (B/A \sin \pi)]$$

where
$\gamma$ = slice angulation relative to a plane perpendicular to the scanning axis of the instrument;
$\pi$ = a constant angle for the particular frustoconical groove;
A = the distance from the groove to the central bore along the major axis of the elliptical image; and
B = the distance or radius of the frustoconical groove at the point where the major axis of the elliptical image crosses the central bore or axis of the groove.

The methods for measuring image slice offset and angulation may also include the additional step of adjusting the instrument so that the offset or angulation indicated by the circuitry of the instrument correponds to the actual offset or angulation indicated by the phantom. Advantageously, this additional step allows the on-site calibration and standardization of the computed tomographic imaging instrument.

Still other objects of the present invention will become readily apparent to those skilled in this art from the following description wherein there is shown and described a preferred embodiment of this invention, simply by way of illustration of one of the modes best suited to carry out the invention. As it will be realized, the invention is capable of other different embodiments and its several details are capable of modifications in various, obvious aspects all without departing from the invention. Accordingly, the drawings and descriptions will be regarded as illustrative in nature and not as restrictive.

BRIEF DESCRIPTION OF THE DRAWING

The accompanying drawing incorporated in and forming a part of the specification, illustrates several aspects of the present invention, and together with the description serves to explain the principles of the invention. In the drawings:

FIG. 5 shows the image that results from a scan taken in a plane perpendicular to the central bore of the phantom and running through the peripheral slot for locating the phantom;

FIG. 6 shows the image that results from a scan taken in a plane perpendicular to the central bore of the phantom other than the plane including the peripheral slot;

FIG. 7 shows the image taken at an angle and producing an elliptical shape;

FIG. 8 shows a trigometric diagram for demonstrating the mathematical accuracy of the image slice offset formula of the method of the present invention; and FIG. 9 shows the trigometric diagram that results from a study of a scan taken in a plane other than perpendicular to the central bore and passing through the frustoconical groove.

Reference will now be made in detail to the present preferred embodiment of the invention, an example of which is illustrated in the accompanying drawings.

BEST MODE OF CARRYING OUT THE INVENTION

Figure 1:
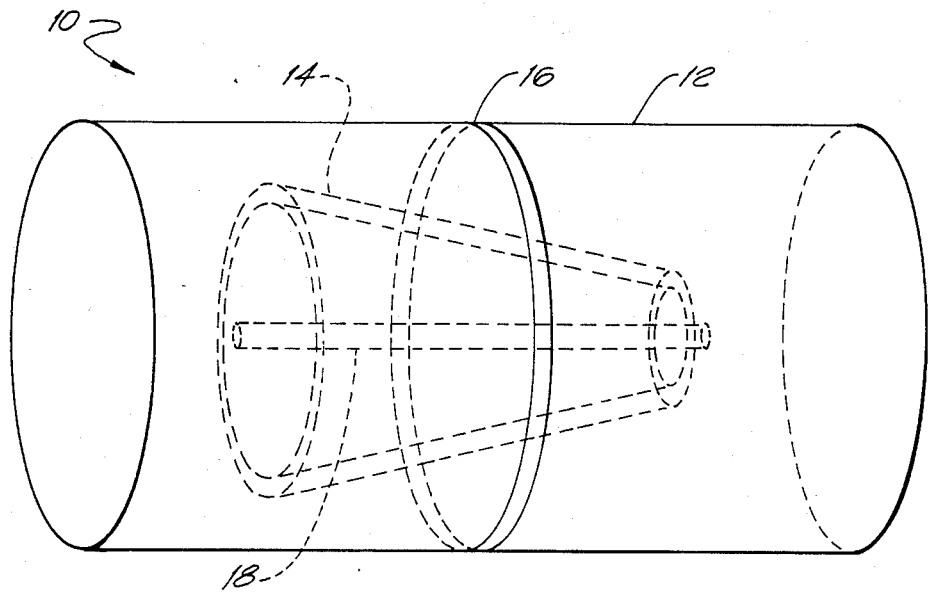
FIG. 1 is a side view perspective of the quality control phantom of the present invention for use in an NMR instrument.
Figure 2:
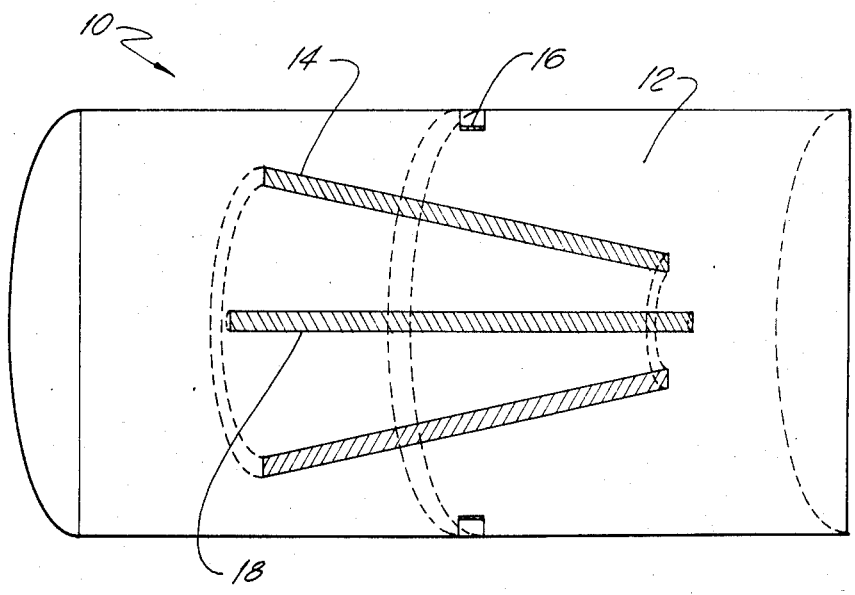
FIG. 2 is a cross-sectional view of the phantom of FIG. 1 illustrating a groove, slot and bore filled with differential material.

Reference is now made to FIGS. 1 and 2 showing a quality control phantom 10 for use in the calibration and standardization of a computed tomographic imaging instrument, such as an NMR instrument. As shown, the preferred embodiment of the phantom 10 includes a cylindrical, slab-like casing 12 that may, for example, be made of cast acrylic plastic. Concentrically disposed and formed within the casing 12 is a frustoconical groove 14. The frustoconical groove 14 is filled with a material of different molecular structure, thus providing distinguishing signal from the casing 12 during scanning with the NMR instrument. Thus, the groove 14 provides a positive and unmistakable scan image. In order to achieve exceptional signal delineation, the signal producing differential material may be a aqueous solution containing any of various concentrations of paramagnetic substances; such as, a solution of manganese chloride ($MnCl_2$), 1,2- propanediol or nickel nitrate ($Ni(NO_3)_2$). A preferred solution is 0.01 molar nickel nitrate.

The phantom also includes an annular slot 16 extending around the periphery of the phantom 10 in the surface of the casing 12. The slot 16, like the frustoconical groove 14, is filled with paramagnetic material, such as nickel nitrate solution, providing a different and distinguishing signal from the casing 12 during NMR scanning. Of course, the differential filler material may be solidified in order to be retained in the open slot 16 (note band of material in the bottom, FIG. 2).

As is discussed below in more detail, the slot 16 provides a means for locating or positioning the phantom 10 in the NMR instrument. Specifically, alignment of the slot 16 with a known point on the machine establishes a home or reference position along the frustoconical groove 14, and thus an initial scanning point. In other words, the locator slot when properly aligned with the machine and the machine operating correctly, produces an image of the groove 14 of known size (see FIG. 5). It is particularly useful for establishing this reference for commencing the measurement of image slice offset. Advantageously, this utilization of a known or predetermined home position as an initial scanning point speeds the analysis of the scan images, and is an important factor in accurately calibrating the NMR machine thus assuring the desired quality control of the NMR scanning operation.

The phantom 10 is further provided with a central bore 18. The central bore 18 corresponds to the central axis of the frustoconical groove 14 that is in turn concentrically located within the casing 12. Like the frustoconical groove 14 and peripheral slot 16, the central bore is preferably filled with a paramagnetic solution of nickel nitrate providing a different and distinguishing signal from the casing 12 during scanning. It should be recognized that the nickel nitrate solution within the groove 14, the slot 16 and bore 18 may be of different molar concentrations to provide different scan intensities, if desired. For greater distinctiveness, the filler material in each of the three areas can, of course, be a different material, rather than simply the same material in different concentrations. As set forth below in detail, the provision of an image producing central bore 18 is particularly helpful when measuring or verifying actual image slice angulation for completing the full standardization and calibration of the NMR instrument circuitry.

The phantom 10 is particularly useful in measuring the image slice offset along the scanning axis. This provides a way of calibrating the offset circuitry of the NMR instrument. By offset it is meant the distance moved from a first position (such as the home position) to a second position along the scanning axis of the instrument. Further, it should be appreciated that the offset along any of the three axes providing sagittal, transverse or coronal scan views may be measured by rotating and properly positioning the phantom 10. However, for purposes of simplicity, the process of use of the phantom 10 for measuring offset along only the longitudinal axis of the instrument is described in detail below. In essence, all that is required for accurately taking measurements along the other axes is to align the center bore 18 parallel with the scanning axis of the instrument that is perpendicular to the plane of the scan.

Figure 3:
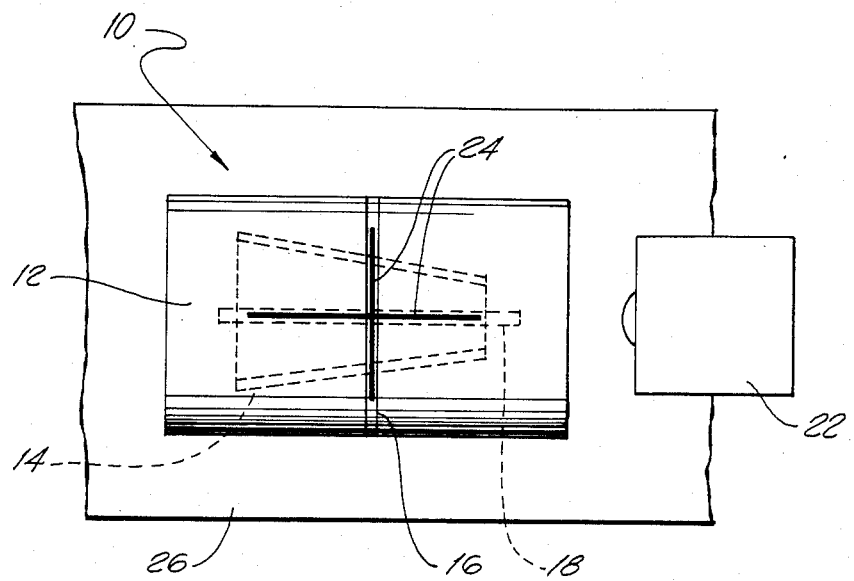
FIG. 3 is a top plan view showing the positioning of the phantom of the present invention on the scanning table under the laser target light of an NMR instrument prior to the movement of the table into the instrument for scanning.
Figure 4:
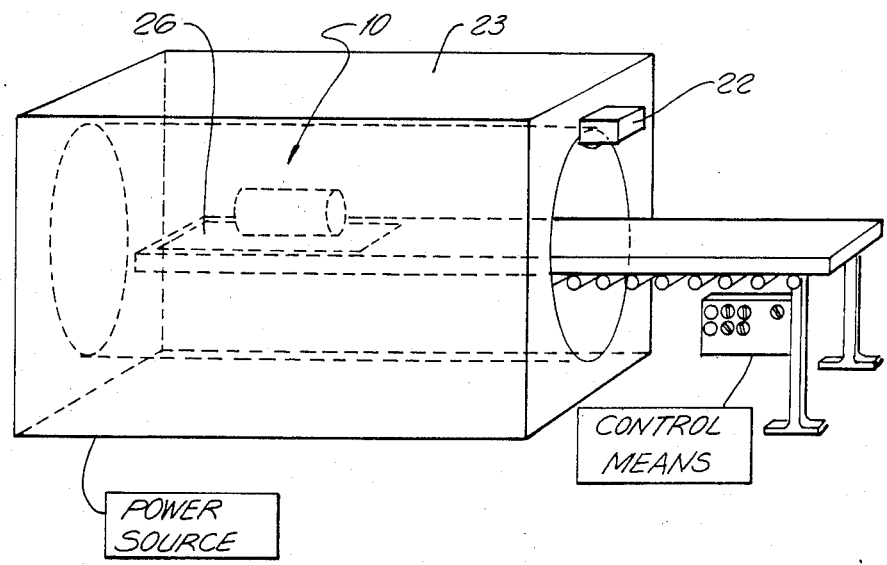
FIG. 4 is an overall view of the NMR instrument in which a phantom is positioned for scanning.

Thus, the method for measuring the image slice offset along the scanning path of an NMR instrument includes the first step of properly positioning the phantom 10 along the longitudinal axis within the instrument. As is known in the art, the NMR instrument is provided with a laser positioning unit that enables the proper positioning of a patient or other object for scanning. As shown in FIGS. 3 and 4, an overhead laser source 22 on the NMR instrument 23 emits a beam that produces a cross hairs image 24 focused upon an underlying scanning table 26. The phantom 10 of the present invention is placed on its side on the scanning table 26 so that the cross hairs image is aligned with the peripheral slot 16 and central bore 18 (see FIG. 3).

Once this is done the table 26 is activated to extend into the NMR instrument (see FIG. 4). As is known in the art, the circuitry of the NMR instrument is designed to extend the table 26 into the instrument so that the portion of the phantom 10 upon which the cross hairs were focused is scanned.

The image slice angulation circuitry of the NMR instrument is then set on 0. The basic scanning circuitry is activated and a scan is taken across the phantom 10 perpendicular to the central bore 18 (note axis in FIG. 1). If the instrument 23 is functioning properly, the resulting scan image should appear as shown in FIG. 5 with the shaded areas bearing the reference numerals (plus a prime suffix) of the respective image producing components of the phantom 10. If, however, the circular image 14', 16' is absent, or a different shape or size image is displayed, the operator immediately knows that the scanning table 26 was not properly extended into the instrument and that that instrument circuitry needs calibrating. If the image 14' is oblong rather than circular, the scan angulation circuitry of the instrument needs adjustment as the scan is not in a perfectly vertical plane.

Assuming, however, that the resulting scan image is as shown in FIG. 5, the first scan thus provides a known, predetermined shape and size annular image 14' of the section of the frustoconical groove 14. By comparing the image 14' with the known image, the decision can be made as to the accuracy of the initial calibration of the instrument. This is important for the calculation of actual image slice offset as discussed below.

The image slice offset circuitry of the NMR instrument is then activated to move the scanning field a selected distance along the longitudinal scanning axis of the instrument. The instrument thus effectively moves parallel to the central bore 18 of the phantom 10. A second scan is then taken perpendicular to the central bore 18 to produce a scan image such as shown in FIG. 6 (again with the image producing phantom components shown).

The radius of the first and second circular images 14', 14" produced by the frustoconical groove 14 during the respective scans are then measured and compared to find the actual offset distance in accordance with the following formula:

$$X = \frac{(B - A)}{A} \cdot C_1$$

where
  X = offset;
  A = first image radius;
  B = second image radius; and
  $C_1$ = a known constant for the particular frustoconical groove 14.

The use of the predetermined or known initial scanning position as represented and verified by the peripheral slot 16 aids greatly in the calculation of offset since it allows the determination of the constant $C_1$. As seen from viewing the schematic diagram of FIG. 8, the frustoconical groove 14 may be represented in two dimensions for purposes of demonstrating the mathematical accuracy of the above formula. In the figure, the lines representing the frustoconical groove 14 and the central bore 18 are numbered 14a and 18a, respectively. Also, the groove representation is shown extended to a point to further aid in demonstrating the calculations.

As is well known, Tan $\alpha = A/L$ and Tan $\alpha = B/(L+X)$. $AL + AX = BL$ and $AX = BL - AL$. Consequently, X or the offset distance equals $(B-A)L/A$. The distance L is found by extending the frustoconical groove 14 as shown by line 14a until it converges to a point P and measuring from that point to the first or home scanning position. Where the first scanning position is known, as when the scan is taken along the peripheral slot 16, the distance L is known for the particular frustoconical groove 14 being used for measuring the offset. Thus, the distance L may be represented by a constant $C_1$.

Of course, following the measurement of the actual offset, the NMR instrument image slice offset circuitry may be calibrated. By adjusting the circuitry, the offset distance moved from a first scan position to a second scan position as indicated by the instrument is made to correspond to the actual offset distance. Thus, the accuracy of the NMR instrument and the image slice offset circuitry is assured so as to provide the physician with the scan positioning control necessary to gain more precise information from which to make a diagnosis of patient condition.

The phantom 10 of the present invention may also be used to measure the actual image slice angulation provided by the circuitry of the NMR instrument. The method for determining the image slice angulation requires the positioning of the phantom within the NMR instrument as discussed above in measuring the image slice offset. Once the phantom 10 is properly positioned, the image slice angulation circuitry of the NMR instrument is activated to provide a selected scanning angle other than perpendicular. A scan is then taken at the selected angle across the phantom 10 and frustoconical groove 14. The resulting elliptical scan image may, for example, appear as shown in FIG. 7. The scan image is then utilized to determine the distance A between the groove image 14' and central bore 18' along the major axis of the elliptical image of the groove. Additionally, the radius of the groove 14' at the point where the major axis of the elliptical image crosses the central bore 18 is determined. This is done by measuring the distance along a line B extending between the central bore image 18' and the groove image 14' perpendicular to the major axis of the elliptical image.

The two distances A, B are then compared to find the actual image slice angulation in accordance with the following formula:

$$\gamma = 180 - \pi - [\arc \sin (B/A \sin \pi)]$$

where
  $\gamma$ = slice angulation;
  $\pi$ = a constant angle for the particular frustoconical groove;
  A = the first distance; and
  B = the second distance;

FIG. 9 shows the frustoconical groove 14 in two dimensions for purposes of demonstrating the mathematical accuracy of the above formula. The lines representing the frustoconical groove and central bore are numbered 14a and 18a, respectively, just as in FIG. 8 with the groove 14 extended to a point P. The plane of the slice or scan is designated by reference numeral 30.

It is well known that the three angles forming a triangle add together to equal 180°. Thus, from viewing FIG. 9, it is known that $\phi = 180 - 90 - \alpha$ or $90 - \alpha$. It is also then known that $\pi = 180 - \pi$ or $90 + \alpha$.

The law of sines provides that for any triangle ABC, A divided by the sin of the angle opposite side A is equal to B divided by the sin of the angle opposite side B. Thus, it is known that $A/\sin \pi = B/\sin \beta$. From this relation, it may be determined that $\beta = \arcsin(B/A \sin \pi)$.

Finally, it is known that $\gamma + \pi + \beta = 180$. Therefore, $\gamma = 180 - \pi - \beta$. Since $\beta = \arcsin(B/A \sin \pi)$, then $\gamma = 180 - \pi - \arcsin(B/A \sin \pi)$. In this equation, $\pi$ is known since $\alpha$ is known for the particular frustoconical groove 14 being utilized in the phantom 10 and $\pi = 90 + \alpha$. Also, as indicated above, A and B are experimentally determined by measuring the distances shown on the scan image (see FIG. 7). Thus, the above equation includes one unknown $\gamma$ and may, therefore, be solved for the image slice angulation $\gamma$. After determining the actual angulation $\gamma$, the NMR instrument image slice angulation circuitry may be adjusted. During adjustment, the angulation indicated by the instrument is made to correspond to the actual angulation indicated by the phantom. Thus, the integrity of the circuitry and thus the calibration of the instrument is assured and the positioning of the scanning field may be accurately controlled by the physician or technician. As a consequence, more complete and accurate scanning information is available from which to base a diagnosis.

The frustoconical groove 14 of the phantom 10 of the present invention may also be used to measure the slice thickness of the scan. This is done by comparing the actual known thickness of the signal producing material forming the groove 14 with the thickness shown on the scan image. Any difference in thickness between the actual and shown values may be proportionally related to the slice thickness of the scan.

Also, as is known in the art, NMR instruments include circuitry for providing the operator with a volume acquisition wherein a series of parallel scans are taken along a particular scanning axis at spaced intervals. The frustoconical groove 14 may be used to determine the actual distance of the spaced intervals by a direct comparison of the radii of the resulting circular images. This, of course, advantageously allows the technician to formulate a more complete scanning picture with the knowledge of the actual adjacency of each scan slice that is taken.

Finally, the position through which a scan is taken through the phantom 10 may be simply determined by relating the distance from the outer edge or periphery of the casing 12 to the frustoconical groove 14. Similarly, this can be done by determining the radius of the resultant circular groove image. These dimensions bear a direct relation to the distance along the bore 18, and thus such distance is easily determined. This is an important feature where the casing 12 includes additional image producing structures, as are known in the art, for measuring such parameters as signal uniformity, $T_1$ and $T_2$ scale contrast, resolution, and the like. By knowing the exact position of the plane through which the slice is taken, it may be determined exactly how the scan image should appear. Thus, the accuracy and calibration of the instrument may again be determined with greater reliability.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

We claim:

1. A quality control phantom for use in the calibration and standardization of a computed tomographic imaging instrument, comprising:
   a slab-like casing formed from a material type compatible with said computed tomographic imaging instrument;
   a frustoconical groove formed in said casing, said groove including a material providing a different image signal from said casing during scanning with the instrument; and
   a central bore formed in said casing, defining a central axis of said frustoconical groove, said central bore including a material providing a different image signal from said casing during scanning with the instrument.

2. The phantom disclosed in claim 1, wherein said casing is constructed of cast acrylic plastic.

3. The phantom disclosed in claim 2, wherein said casing is substantially cylindrical in shape.

4. The phantom disclosed in claim 1, wherein is further provided means for locating the phantom in the instrument so as to provide a predetermined position along said frustoconical groove as an initial scanning point for the measurement of image slice offset.

5. The phantom disclosed in claim 4, wherein said locating means comprises a slot around the periphery of said casing, said slot including a material providing a different signal from said casing during scanning with the instrument.

6. The phantom disclosed in claim 1, wherein the material in said frustoconical groove and said central bore is paramagnetic.

7. The phantom disclosed in claim 6, wherein said material is a solution of nickel nitrate.

8. A method for measuring the image slice offset along a scanning axis of a computed tomographic imaging instrument, comprising:
   positioning a phantom including a signal producing frustoconical groove in the instrument so that a central axis of the groove is parallel to the scanning axis of the instrument;
   scanning across said frustoconical groove at a predetermined first position at an angle perpendicular to the central axis of the groove so as to obtain a first circular image;
   scanning across said frustoconical groove at a second position at an angle perpendicular to the central axis of the groove so as to obtain a second circular image; and
   comparing the radii of the first and second circular images so as to determine and verify the distance moved along the scanning axis between said first and second positions.

9. The method disclosed in claim 8, wherein said comparing step is performed in accordance with the following formula:

$$X = \frac{(B-A)}{A} \cdot C_1$$

wherein

X = offset along the scanning axis;

A = first image radius;

B = second image radius; and $C_1$ = a known constant for the particular frustoconical groove.

10. The method disclosed in claim 9, including the additional step of adjusting the instrument so that the offset distance moved along the scanning axis between said first and second positions as indicated by the instrument corresponds to the actual distance moved as indicated by the phantom.

11. A method for measuring the image slice angulation along the scanning axis of a computed tomographic imaging instrument using a phantom including an image producing frustoconical groove and an image producing central bore corresponding to the central axis of the groove, comprising the steps of:

positioning the phantom in the instrument so that the central bore is parallel to the scanning axis of the instrument;

scanning at an angle across the frustoconical groove so as to obtain an elliptical scanning image of the groove;

determining a first distance along a major axis of the elliptical image from the groove image to the central bore image and a second distance along a line perpendicular to the major axis of the elliptical image from the central bore image to the groove image; and comparing the first and second distances so as to verify and measure the angle between the scan across the frustoconical groove and a plane perpendicular to the central bore of the phantom.

12. The method disclosed in claim 11, wherein said comparing step is performed in accordance with the following formula:

$$\gamma = 180 - \pi - [\text{arc sin}\, (B/A \sin \pi)]$$

wherein $\gamma$ = slice angulation;

$\pi$ = a constant angle for the particular frustoconical groove;

A = the first distance;

B = the second distance.

13. The method disclosed in claim 12, including the additional step of adjusting the instrument so that the angle of the scan indicated by the instrument corresponds to the actual angle of the scan indicated by the phantom.

* * * * *